(12) United States Patent
Kasuga

(10) Patent No.: US 6,858,949 B2
(45) Date of Patent: Feb. 22, 2005

(54) SEMICONDUCTOR MEMORY DEVICE AND METHOD FOR ARRANGING MEMORY CELLS

(75) Inventor: Kenji Kasuga, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/674,612

(22) Filed: Sep. 30, 2003

(65) Prior Publication Data

US 2004/0062101 A1 Apr. 1, 2004

(30) Foreign Application Priority Data

Sep. 30, 2002 (JP) .................................... 2002-285245

(51) Int. Cl.[7] .............................................. H01L 27/11
(52) U.S. Cl. ...................................................... 257/903
(58) Field of Search ........................................ 257/903

(56) References Cited

U.S. PATENT DOCUMENTS 6,373,107 B1 * 4/2002 Nikaido ...................... 257/379

FOREIGN PATENT DOCUMENTS

JP          08-274271       10/1996   ................ 27/10

* cited by examiner

Primary Examiner—David Nelms
Assistant Examiner—Tu-Tu Ho
(74) Attorney, Agent, or Firm—Arent Fox

(57) ABSTRACT

A memory cell array of a semiconductor memory device includes a first sub array configured by a plurality of first cell units, a second sub array configured by a plurality of second cell units, and a non-memory cell region used for a backgate and arranged between the two sub arrays. Memory cells located on each side of the non-memory cell region are oriented in the same direction. Pairs of bit lines have substantially the same number of bit line contacts.

24 Claims, 12 Drawing Sheets

- ● Contact
- ▨ Source/Drain
- ▦ Poly Gate
- ☐ Metal Wiring
- ☐ Arrangement Unit (2 Bits)

SEMICONDUCTOR MEMORY DEVICE AND METHOD FOR ARRANGING MEMORY CELLS

CROSS-REFERENCES TO RELATED APPLICATIONS

This application is based upon and claims the benefit of priority from prior Japanese Patent Application No. 2002-285245 filed on Sep. 30, 2002, the entire contents of which are incorporated herein by reference.

BACKGROUND OF THE INVENTION

The present invention relates to a semiconductor memory device and a method for arranging memory cells.

FIG. 1 shows a memory cell array 71 including a plurality of (eight shown in FIG. 1) memory cells 72a and 72b that are arranged in accordance with a prior art layout. Two pairs of bit lines (i.e., the first pair being bit line BLA and X bit line XBLA, and the second pair being bit line BLB and X bit line XBLB) connect the memory cells 72a and 72b to one another.

In the prior art memory cell array 71, the memory cell array 71 is configured by a plurality of memory cell units 72. Each memory cell unit 72 includes an even number (e.g., two) of the memory cells 72a and 72b. As shown by the letter F in FIG. 1, adjacent memory cells 72a and 72b are reversed from each other and extend perpendicular to an X axis direction.

Due to the miniaturization of transistors during these recent years, the areas of the memory cells 72a and 72b have been reduced. This has made it difficult to arrange contacts in the memory cells 72a and 72b that are connected with the backgates of transistors.

Japanese Laid-Open Patent Publication No. 8-274271 proposes a solution for solving this problem. As shown in FIG. 2, a non-memory cell region 73 is provided at predetermined intervals in the direction that the bit lines extend (Y axis). In other words, a non-memory cell region 73 is provided for every predetermined number (eight in FIG. 2) of the memory cells 72a and 72b. Backgates are arranged in the non-memory cell region 73.

In the layout of FIG. 2, due to the non-memory cell region 73, the number of bit line contacts differs between the bit line BLA and the X bit line XBLA. The number of bit line contacts also differs between the bit line BLB and the X bit line BLB.

More specifically, in FIG. 2, the number of bit line contacts in each of the bit lines BLA and BLB is six, and the number of bit line contacts in each of the X bit lines XBLA and XBLB is four. As the number of the non-memory cell regions 73 in the memory cell array 71 increases, the difference in the number of bit line contacts between the related bit lines increases.

When the number of bit line contacts differs between the related bit lines, the source-drain capacitance and wire load of the transistor connected to one of the bit lines (in this example, the X bit lines XBLA and XBLB) is greater than the other one of the bit lines (in this example, the bit lines BLA and BLB). Referring to FIG. 3, this results in shortcomings such as the amplitude of bit line signals generated in the X bit lines XBLA and XBLB, which have a relatively large load, being insufficient, and the access time for reading data being long. This problem also occurs when writing data. Thus, in the prior art, reading and writing operations are not performed stably.

SUMMARY OF THE INVENTION

One aspect of the present invention is a method for arranging a plurality of memory cells in a predetermined direction along which at least one pair of bit lines extend and to which the memory cells are connected. The method includes arranging a first memory and a second memory alternately and adjacent to each other in a predetermined direction. The second memory cells have a symmetric geometrical relationship with the first memory cell with respect to an axis perpendicular to the pair of bit lines. The method further includes arranging a non-cell region adjacent to one of the first and second memory cells in the predetermined direction, and arranging a third memory cell having an asymmetric geometrical relationship with one of the first and second memory cells with respect to the axis in the predetermined direction adjacent to the non-cell region.

A further aspect of the present invention is a method for arranging a plurality of memory cells along at least one pair of bit lines extending in a predetermined direction. The memory cells each have a first side and a second side that are parallel to a perpendicular axis, which is perpendicular to the at least one pair of bit lines. The method includes forming a first sub array with at least one first memory cell unit including an even number of memory cells arranged adjacent to one other in the predetermined direction so that the adjacent memory cells have a symmetric geometrical relationship relative to the perpendicular axis. The first side is defined on each of opposite ends of the first memory cell unit in the predetermined direction. The method further includes forming a second sub array with at least one second memory cell unit including an even number of memory cells arranged adjacent to one another in the predetermined direction so that the adjacent memory cells have a symmetric geometrical relationship relative to the perpendicular axis. The second side is defined on each of opposite ends of the second memory cell unit in the predetermined direction and alternately arranging the first sub array and the second sub array in the predetermined direction with a non-cell region located in between.

A semiconductor memory device including a bit line extending in a predetermined direction and a memory cell array including a plurality of memory cells arranged along the bit line. The plurality of memory cells includes a first memory cell, a second memory cell adjacent to the first memory cell in the predetermined direction and having a geometric shape that is symmetric to the first memory cell with respect to an axis perpendicular to the bit line, a non-cell region adjacent to the second memory cell in the predetermined direction, and a third memory cell arranged adjacent to the non-cell region in the predetermined direction. The third memory cell and the second memory cell have the same geometric shape and are oriented in the same direction.

A further aspect of the present invention is a method for designing a memory cell array having a pair of bit lines extending in a predetermined direction. The method includes arranging a first memory cell and a second memory cell so that the first and second memory cells have a mirror image relationship with respect to a plane perpendicular to the pair of bit lines, arranging a non-cell region adjacent to the second memory cell in the predetermined direction, and arranging a third memory adjacent to the non-cell region in the predetermined direction so that the third memory cell is oriented in the same direction as the second memory cell.

A further aspect of the present invention is a semiconductor device including a first bit line pair extending in a predetermined direction, a second bit line pair extending in the predetermined direction, a first memory cell connected to the first bit line pair and the second bit line pair, and a second memory cell connected to the first bit line pair and the second bit line pair adjacent to the first memory cell. The first memory cell and the second memory cell are in a mirror image relationship with respect to a plane perpendicular to the bit line. A non-memory cell is adjacent to the second memory cell. A third memory cell is adjacent to the non-cell region. The third memory cell and the second memory cell are oriented in the same direction.

A further aspect of the present invention is a semiconductor memory device including a bit line extending in a predetermined direction. The semiconductor memory device includes a first memory cell, a second memory cell adjacent to the first memory cell in the predetermined direction and being symmetric to the first memory cell with respect to a plane perpendicular to the predetermined direction, a non-cell region adjacent to the second memory cell, a third memory cell adjacent to the non-cell region and having an asymmetric geometrical relationship with the second memory cell with respect to the plane, and a fourth memory cell adjacent to the third memory cell in the predetermined direction and symmetric to the third memory cell with respect to a plane perpendicular to the predetermined direction.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A memory cell layout according to a first embodiment of the present invention will now be discussed.

Figure 1:
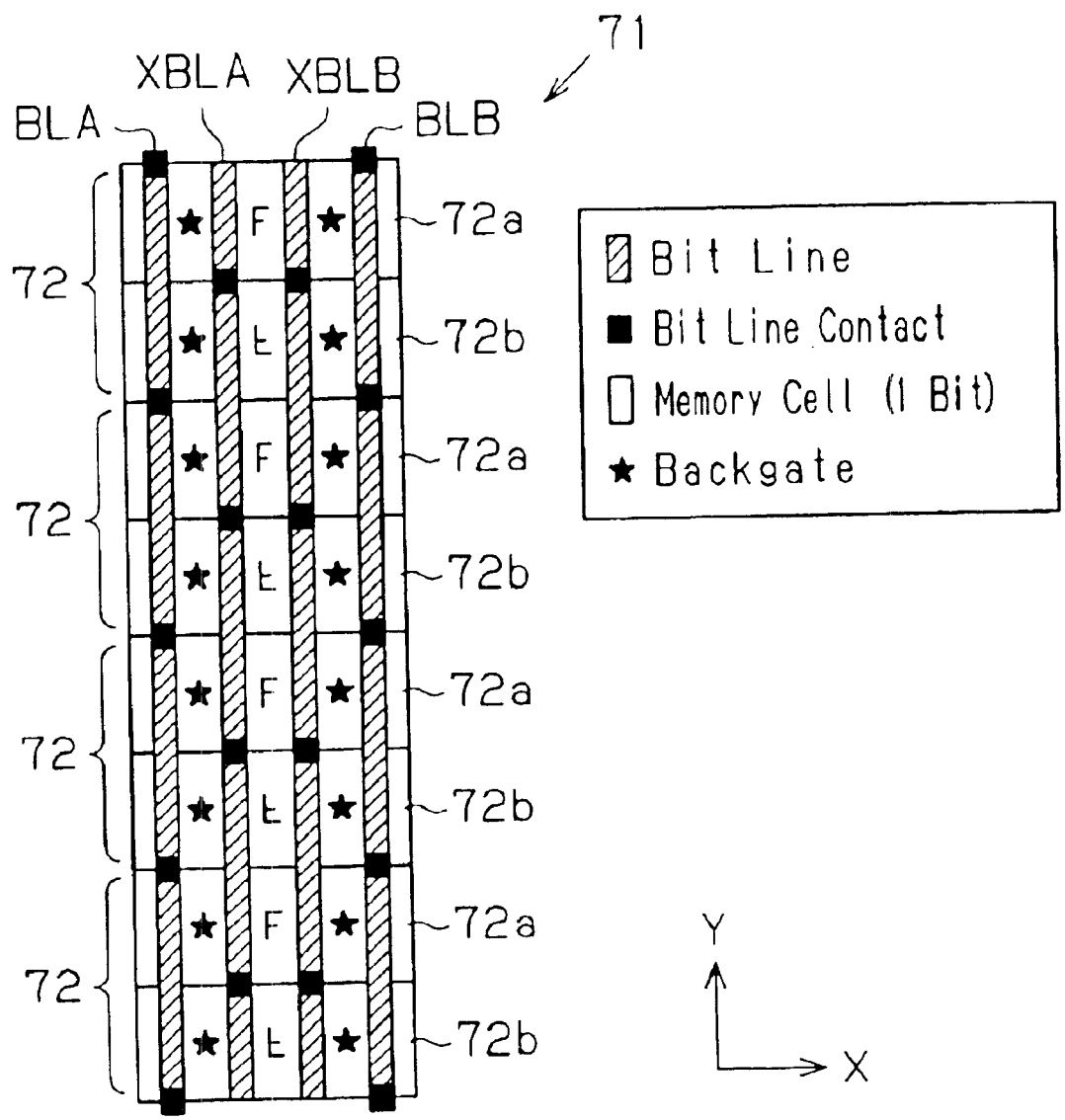
FIGS. 1 and 2 are diagrams showing the layout of memory cells in the prior art.
Figure 2:
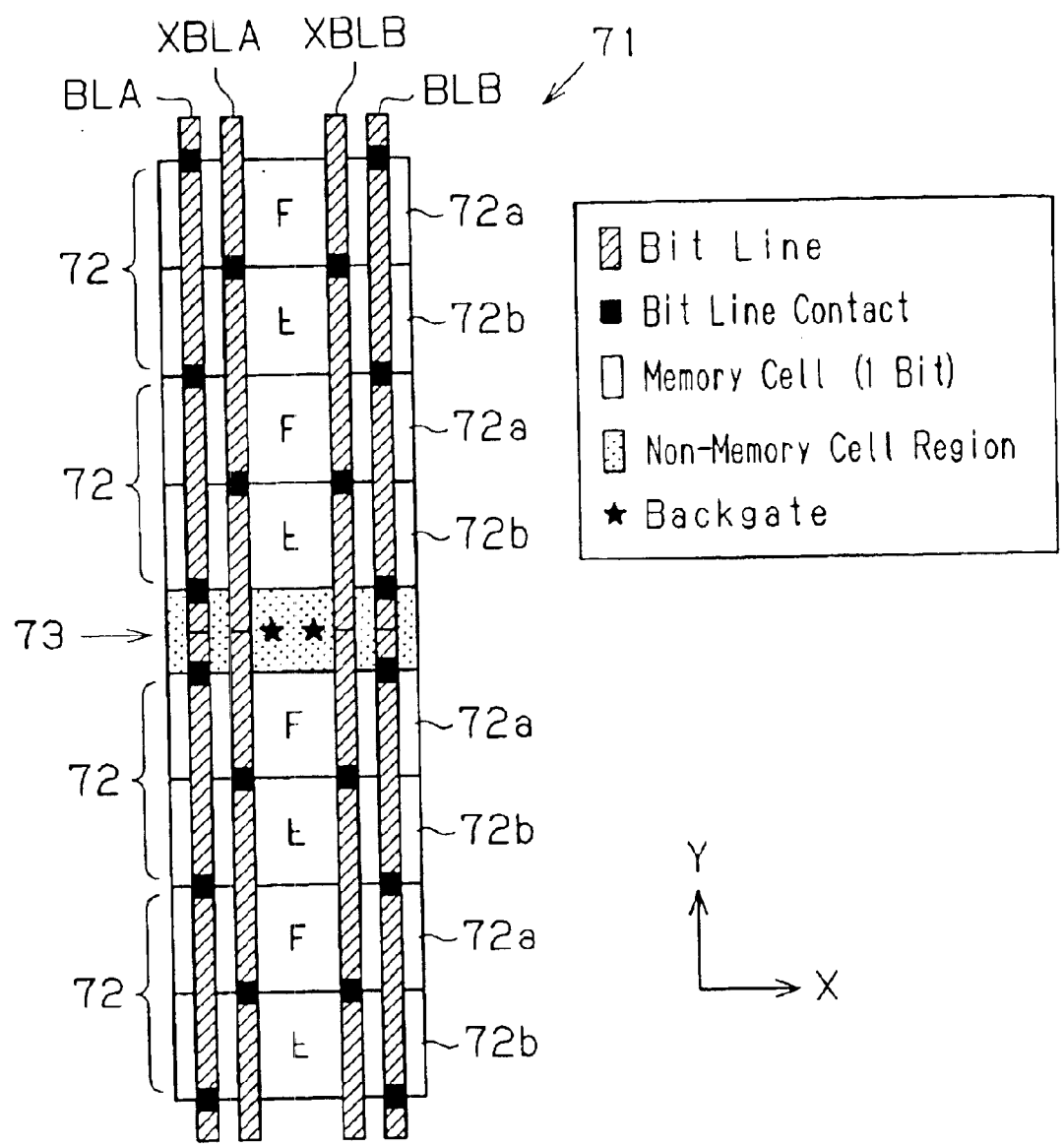
Figure 3:
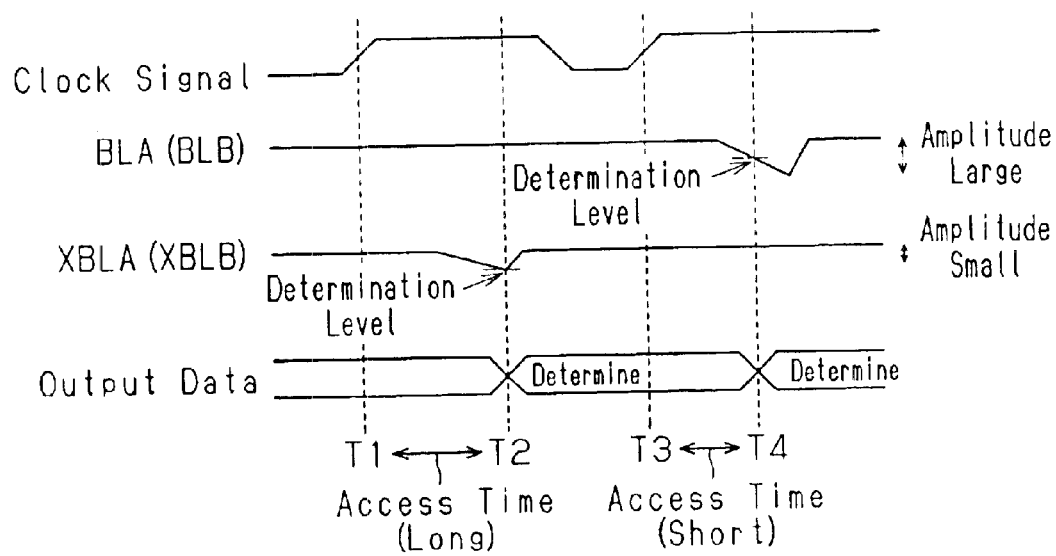
FIG. 3 is a waveform chart taken during a read operation in a semiconductor memory device having memory cells arranged in accordance with the prior art layout.
Figure 4:
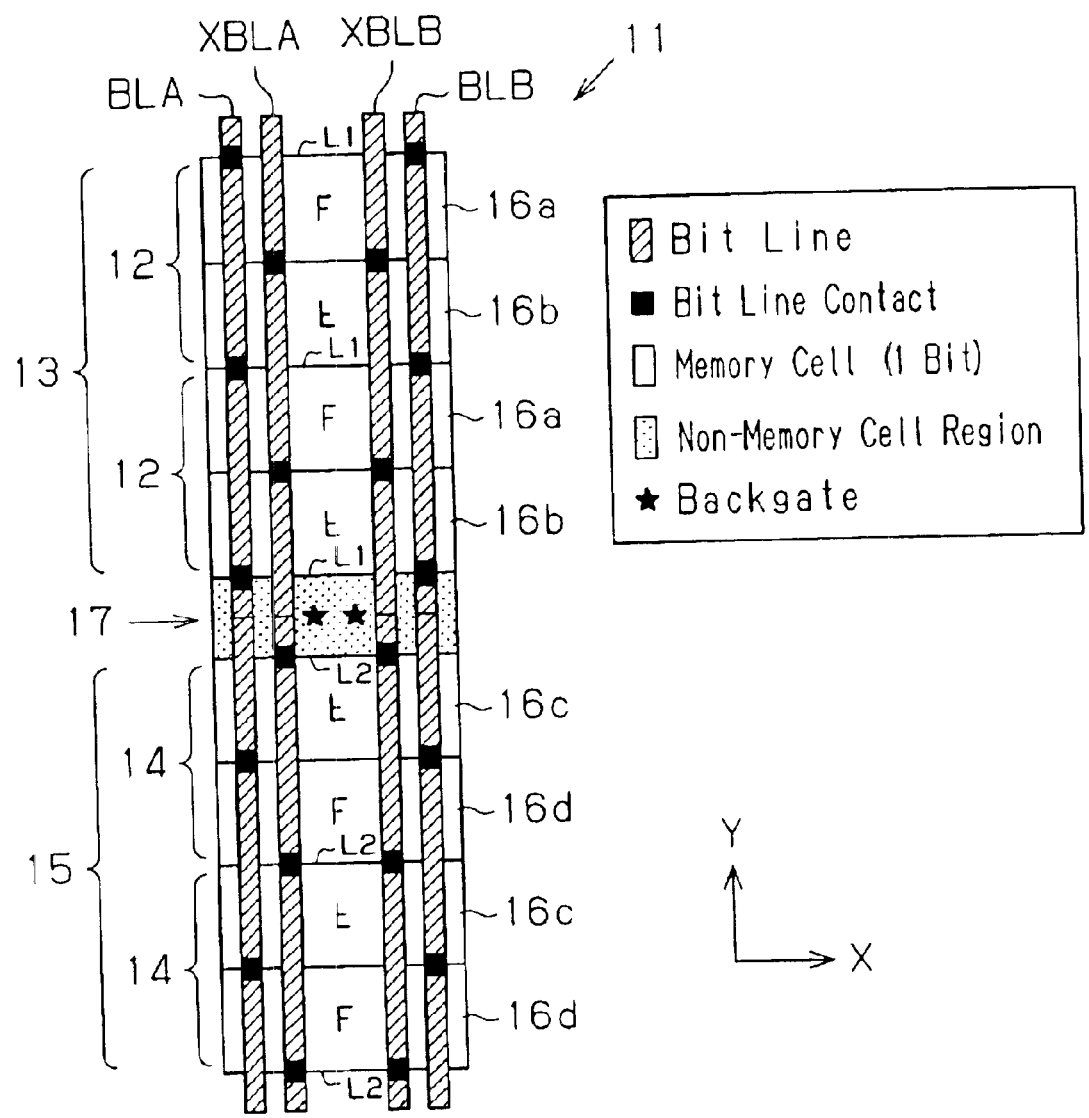
FIG. 4 is a diagram showing a memory cell layout according to a preferred embodiment of the present invention.

Referring to FIG. 4, a memory cell array 11 includes a first sub array 13, which is configured by first memory cell units (hereafter referred to as first cell units) 12, and a second sub array 15, which is configured by second memory cell units (hereafter referred to as second cell units) 14.

The first cell unit 12 is configured by an even number (for example, two) of memory cells 16a and 16b. Each of the memory cells 16a and 16b are connected to four bit lines BLA, BLB, XBLA, and XBLB. Among these four, two are referred to as first bit lines BLA and BLB and two are referred to as second bit lines (X bit lines) XBLA and XBLB. The first bit line BLA and the second bit line XBLA are complementary with each other, and the first bit line BLB and the second bit line XBLB are complementary with each other.

Each first cell unit 12 is configured by arranging the two types of the memory cells 16a and 16b alternately along the bit lines, or in the Y axis direction. In each first cell unit 12, the memory cells 16a and 16b have a symmetric geometrical relationship and are symmetric to each other with respect to a symmetry axis extending in the X axis direction, which is perpendicular to the bit lines. The letter F on the memory cells 16a and 16b in FIG. 4 indicates the reversed relationship of the memory cells 16a and 16b. In other words, the memory cells 16a and 16b are in a mirror image relationship with respect to a plane perpendicular to the Y axis.

Figure 5A:
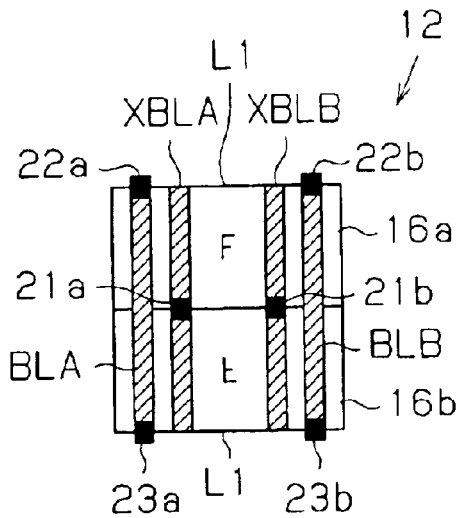
FIG. 5A is a schematic diagram showing a first memory cell unit.

Referring to FIG. 5A, the memory cells 16a and 16b of the first cell unit 12 each have a first side L1 that shares the first bit lines BLA and BLB with the adjacent one of the memory cells 16a and 16b. The first side L1 is parallel to the X axis, which is perpendicular to the bit lines. Each of the first sides L1 in the cell unit 12 is arranged next to one of the first sides L1 of the adjacent cell unit 12.

The first cell units 12 are arranged adjacent to each other to configure the first sub array 13. Thus, the memory cells 16a and 16b, which are symmetric to each other, are arranged alternately in a predetermined direction in the first sub array 13. Further, the adjacent memory cells 16a and 16b share bit line contacts, which are arranged on each bit line. Thus, the adjacent memory cells 16a and 16b share the source and drain of a transistor (not shown in FIG. 4) connected to a bit line contact.

The second cell unit 14 is configured by an even number (for example, two) of memory cells 16c and 16d. The memory cells 16c and 16d are connected to the bit lines BLA, BLB, XBLA, and XBLB. Each second cell unit 14 is configured by arranging two types of the memory cells 16c and 16d alternately along the bit lines, or in the Y axis direction. In each second cell unit 14, the memory cells 16c and 16d have a symmetric geometrical relationship and are symmetric to each other with respect to a symmetry axis extending in the X axis direction. Refer to the letter F in FIG. 4.

Figure 6A:
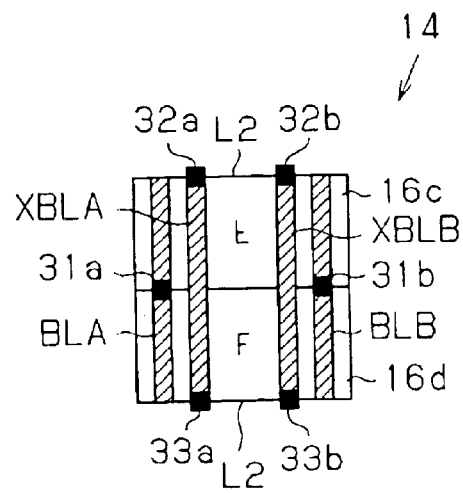
FIG. 6A is a schematic diagram showing a second memory cell unit.

Referring to FIG. 6A, the memory cells 16c and 16d of the second cell unit 14 each have a second side L2 that shares the second bit lines XBLA and XBLB with the adjacent one of the memory cells 16c and 16d. Each of the second sides L2 in the cell unit 14 is arranged next to one of the second sides L2 of the adjacent cell unit 14.

In other words, the memory cells 16c and 16d of the second cell unit 14 have a geometric shape obtained by reversing the memory cells 16a and 16b of the first cell unit 12 with respect to the X axis direction.

The second cell units 14 are arranged adjacent to each other to configure the second sub array 15. Thus, the memory cells 16c and 16d, which are symmetric to each other, are arranged alternately in a predetermined direction in the second sub array 15. Further, the adjacent memory cells 16c and 16d share bit line contacts, which are arranged on each bit line. Thus, the adjacent memory cells 16c and 16d share the source and drain of a transistor (not shown in FIG. 4) connected to a bit line contact.

The first sub array 13 and the second sub array 15 are arranged alternately with a non-memory cell region 17, in which there are no memory cells, in between. Accordingly, one non-memory cell region 17 is provided for every predetermined number of memory cells (eight cells in the example of FIG. 4). The non-memory cell region 17 includes a contact connected to the backgate of a transistor.

The first and second cell units 12 and 14 will now be discussed in detail.

FIG. 5A shows a first cell unit 12. In the first cell unit 12, the adjacent memory cells 16a and 16b share bit line contacts 21a and 21b, which are provided in the second bit lines (X bit lines XBLA and XBLB). Further, the memory cell 16a of the first cell unit 12 and the memory cell 16b of another first cell unit 12 share bit line contacts 22a, 23a, 22b, 23b, which are provided in the first bit lines (BLA and BLB).

Figure 5B:
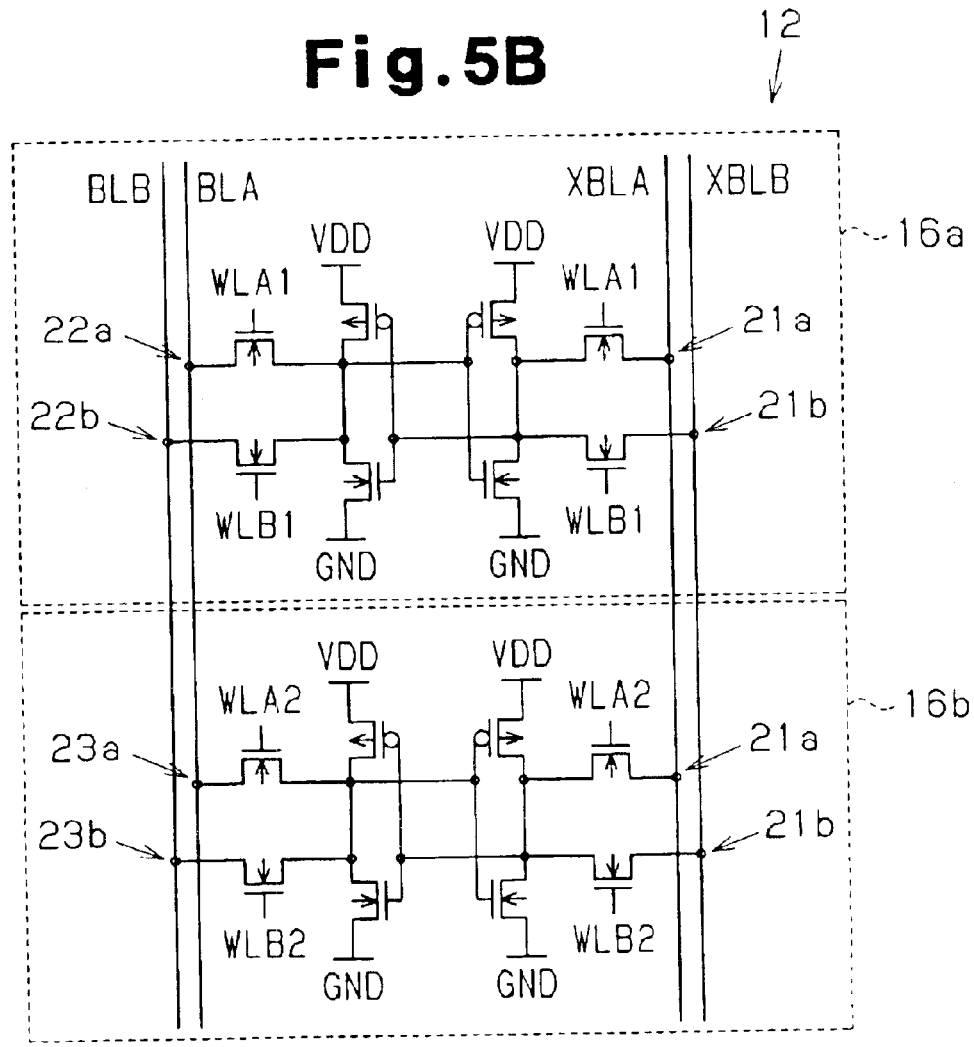
FIG. 5B is a circuit diagram of the first memory unit.

FIG. 5B is a circuit diagram of the first cell unit 12. Each of the memory cells 16a and 16b configuring the first cell unit 12 is, for example, an eight transistor type static random access memory (SRAM) memory cell that includes four transistors functioning as a data holding circuit and four transistors functioning as an access switch circuit. As shown in FIG. 5B, the sources and drains of transistors in the two memory cells 16a and 16b are connected to the X bit lines XBLA and XBLB via the same bit line contacts 21a and 21b.

FIG. 6A shows the layout of a second cell unit 14. In the second cell unit 14, the adjacent memory cells 16c and 16d share bit line contacts 31a and 31b, which are provided in the first bit lines (BLA and BLB). Further, the memory cell 16c of the second cell unit 14 and the memory cell 16d of another second cell unit 14 share bit line contacts 32a, 33a, 32b, 33b, which are provided in the second bit lines (XBLA and XBLB).

Figure 6B:
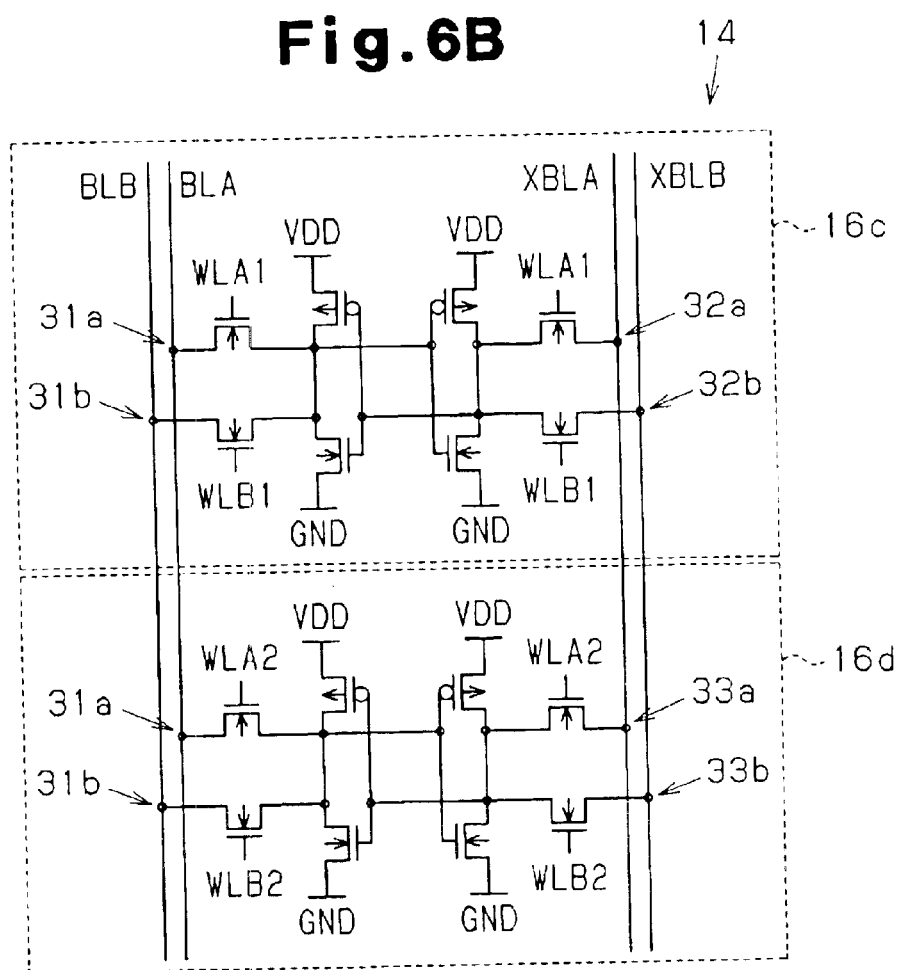
FIG. 6B is a circuit diagram of the second memory cell unit.

FIG. 6B is a circuit diagram of the second cell unit 14. Each of the memory cells 16c and 16d configuring the second cell unit 14 is, for example, an eight transistor type SRAM memory cell that includes four transistors functioning as a data holding circuit and four transistors functioning as an access switch circuit. As shown in FIG. 6B, the sources and drains of transistors in the two memory cells 16c and 16d are connected to the bit lines BLA and BLB via the same bit line contacts 31a and 31b.

The memory cell array 11 of FIG. 4 is configured from the first and second cell units 12 and 14. The first sub array 13 is configured using at least one first cell unit 12. The non-memory cell region 17, which includes the backgates of the transistors, is arranged next to the first sub array 13. The second sub array 15 is configured using at least one second cell unit 14 and arranged next to the non-memory cell region 17.

Due to such layout of the sub arrays 13 and 15, the memory cells on each side of the non-memory cell region 17 are asymmetric to each other. The letters F on the memory cells 16b and 16c located on each side of the non-memory cell region 17 in FIG. 4 are marked in the same direction. This indicates that these memory cells 16b and 16c are asymmetric relative to the X axis direction. That is, the memory cells 16b and 16c are oriented in a predetermined direction. Thus, for example, parallel movement of the memory cell 16c in the Y axis direction would result in the memory cell 16c overlapping the memory cell 16b.

In the memory cell array 11, the number of bit line contacts in the bit line BLA is substantially the same as the number of bit line contacts in the X bit line XBLA. Further, the number of bit line contacts in the bit line BLB is substantially the same as the number of bit line contacts in the X bit line XBLB. In FIG. 4, each bit line has five bit line contacts. Thus, the source-drain capacitance and wire load of the transistors connected to the two bit lines that are complementary to each other (bit line BLA and X bit line XBLA, and bit line BLB and X bit line XBLB) are about the same.

Figure 7:
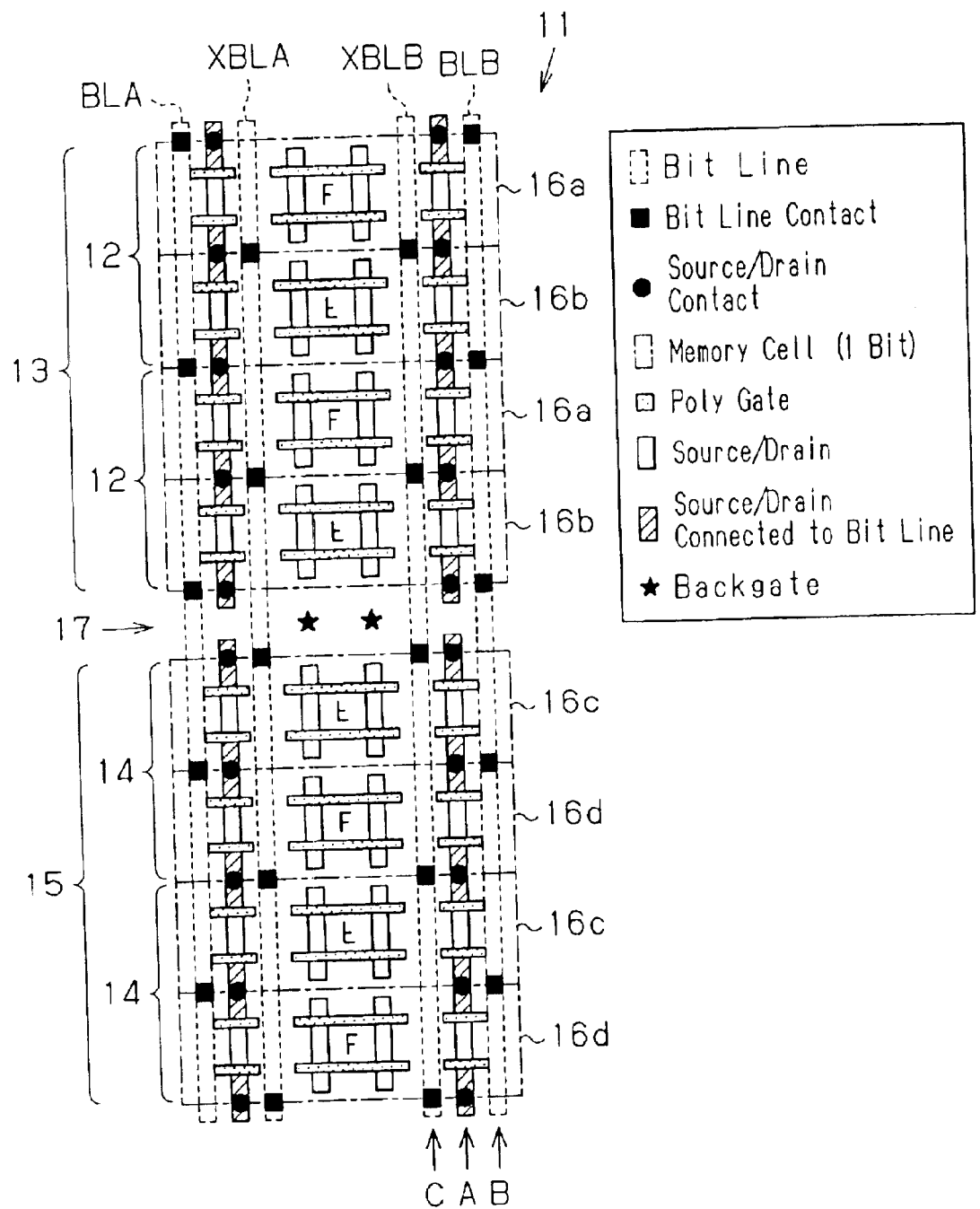
FIG. 7 is an explanatory diagram showing a bulk structure of the layout of FIG. 4.

FIG. 7 shows a bulk structure of the memory cell array 11 of FIG. 4.

Adjacent memory cells 16a and 16b or 16c and 16d share the bit line contacts of the bit line BLA and the X bit line XBLA, the bit line contacts of the bit line BLB and the X bit line XBLB, and the sources and drains of the transistors connected to the bit line contacts.

Figure 8:
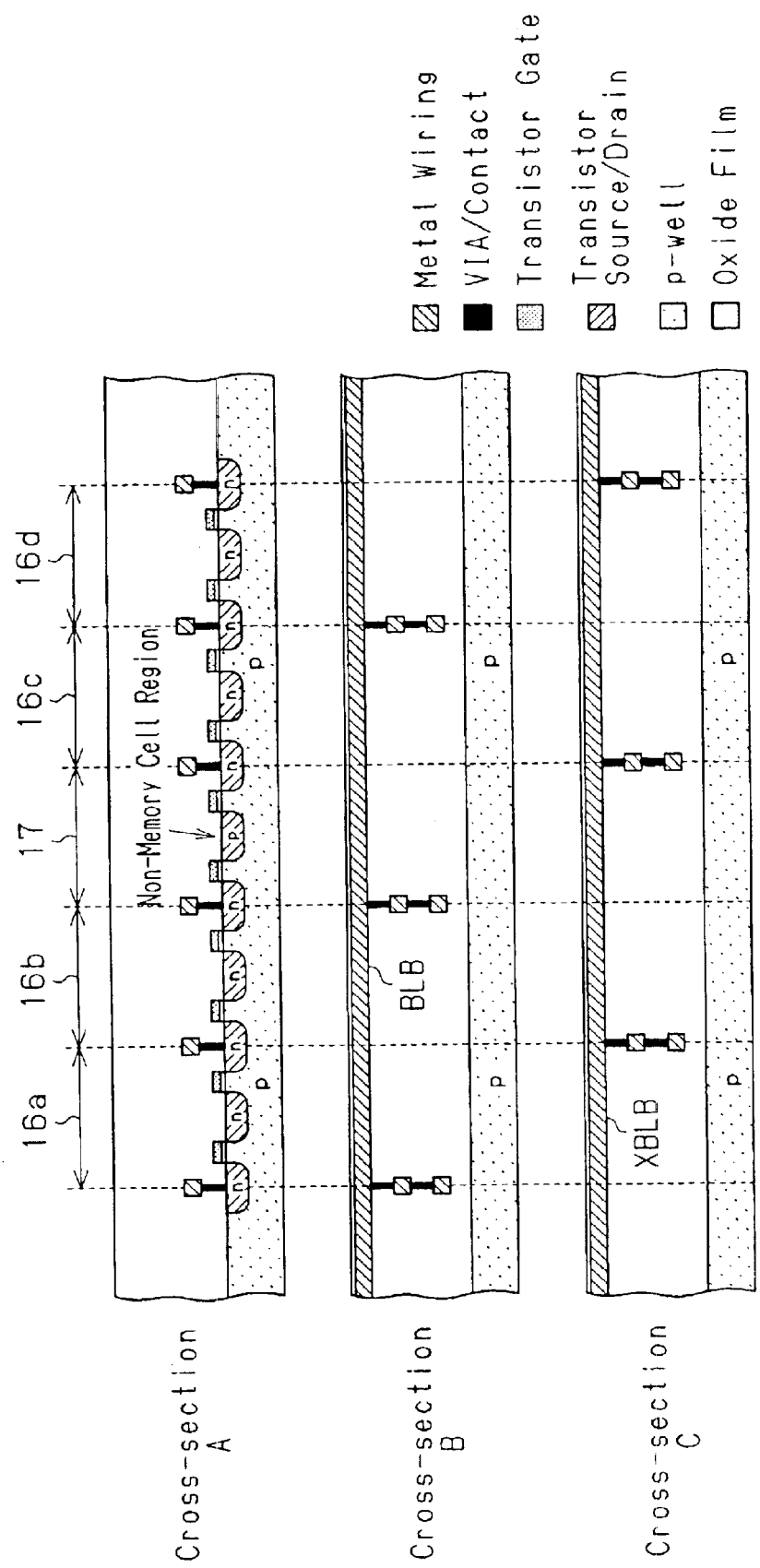
FIG. 8 is a cross-sectional diagram of the bulk structure of FIG. 8.

As shown in FIG. 8, contacts for sources and drains (source-drain contact) are connected to bit line contacts shared by memory cells via a plurality of wire layers (two layers shown in FIG. 8). In this manner, adjacent memory cells share bit line contacts, sources, and drains to reduce the layout area of each of the memory cells 16a to 16d.

Figure 9:
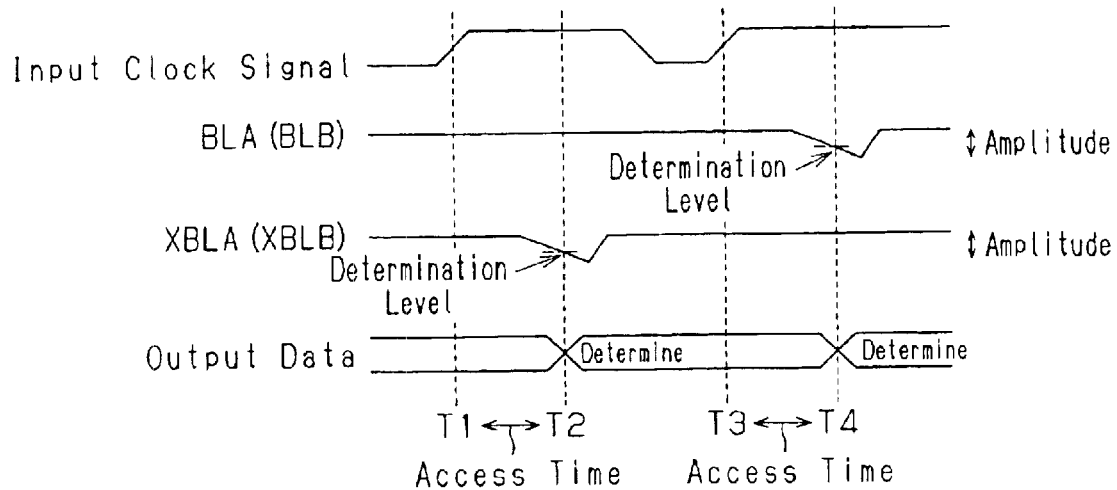
FIG. 9 is a waveform chart taken during a read operation in a semiconductor device having memory cells arranged in accordance with the preferred embodiment.

FIG. 9 is a waveform chart taken during a read operation of a semiconductor memory device formed with the layout of the first embodiment.

In the first embodiment, the two bit lines (the bit line BLA and the X bit line XBLA, and the bit line BLB and the X bit line XBLB) of a bit line pair substantially have the same number of bit line contacts. Thus, the load (source-drain capacitance and wire load) of the two bit lines are substantially the same.

The amplitude (bit line amplitude) of the read signals read from the bit lines BLA and BLB and from the X bit lines XBLA and XBLB are about the same, as shown in FIG. 9. As a result, the access time (the period between time T1 and T2 and the period between time T3 and T4) for reading data from the bit lines BLA and BLB and the X bit lines XBLA and XBLB are substantially the same. This also improves the access time for writing data (not shown).

Figure 10:
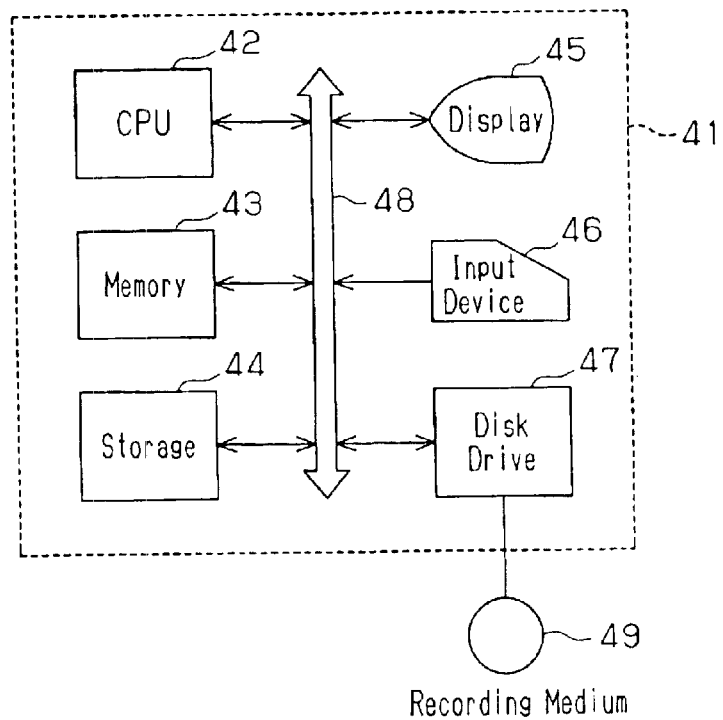
FIG. 10 is a schematic diagram showing a computer system.

FIG. 10 shows a computer system 41, which is a conventional computer aided design (CAD) device. The computer system 41 is used to lay out the memory cells used in the first and second cell units 12 and 14 (i.e., design a semiconductor memory device).

The computer system 41 includes a central processing unit (CPU) 42, a memory 43, a storage device 44, a display 45, an input device 46, and a drive device 47, which are connected to one another by a bus 48.

The CPU 42 uses the memory 43 to execute a program and perform processes that are required to design a semiconductor device. The memory 43 is normally a cache memory, a system memory, or a display memory.

The display 45 is used to show a layout, a parameter input page, and the like. The display 45 in normally a CRT, an LCD, a PDP, or the like. The input device 46 is used by a user to input a request, a command, or a parameter. The input device includes a keyboard and a mouse.

The storage device 44 is, for example, a magnetic disk device, an optical disc device, or a magneto-optic disc. The storage device 44 stores program codes, which are used to design a semiconductor memory device, and data files of libraries registering the cell data of the first and second cell units 12 and 14. The CPU 42 transfers program codes or the data stored in the data files to the memory 43 in response to commands from the input device 46 and sequentially executes the program codes. The storage device 44 may also be used as a database.

A recording medium 49 provides the program codes. The drive device 47 accesses the recording medium 49. The CPU 42 reads a program code from the recording medium 49 via the drive device 47 and installs the program code in the storage device 44.

Any type of recording medium, such as a memory card, a flexible disk, an optical disc (CD-ROM, DVD-ROM, etc.), or a magneto-optic disc (MO, MD, etc.) may be used as the recording medium 49. The recording medium 49 may store programs and load the programs to the memory 43 when necessary. The recording medium 49 may be a medium or disc device that records programs uploaded or downloaded by means of a communication means.

The first embodiment has the advantages described below.

(1) The memory cell array 11 of the semiconductor device is configured by the first sub array 13, which includes at least one first cell unit 12, and a second sub array 15, which includes at least one second cell unit 14. More specifically, the at least one cell unit 12 configures the first sub array 13, the non-memory cell region 17 used for backgates is configured adjacent to the first sub array 13, and the at least one second cell unit 14 configures the second sub array 15 next to the non-memory cell region 17. Thus, the two memory cells 16b and 16c on each side of the non-memory cell region 17 are asymmetric to each other. The pairs of the bit lines (the bit line BLA and the X bit line XBLA, and the bit line BLB and the X bit line XBLB) have substantially the same number of bit line contacts. Thus, the source-drain capacitance and the wire load of the bit lines are substantially the same in the bit lines. Further, the access time for reading and writing data are substantially the same in the bit lines.

(2) The adjacent memory cells 16a and 16b or 16c and 16d share bit line contacts and the sources and drains of the transistors connected to the contacts. This reduces the layout area of the memory cells 16a to 16d.

(3) The layout of memory cells is performed using units of the first cell unit 12, which is configured by an even number of the memory cells 16a and 16b, and units of the second cell unit 14, which is configured by an even number of the memory cells 16c and 16d. Thus, the layout of memory cells, or the designing of a semiconductor memory device, is performed with high efficiency.

A second embodiment of the present invention will now be discussed.

Figure 11:
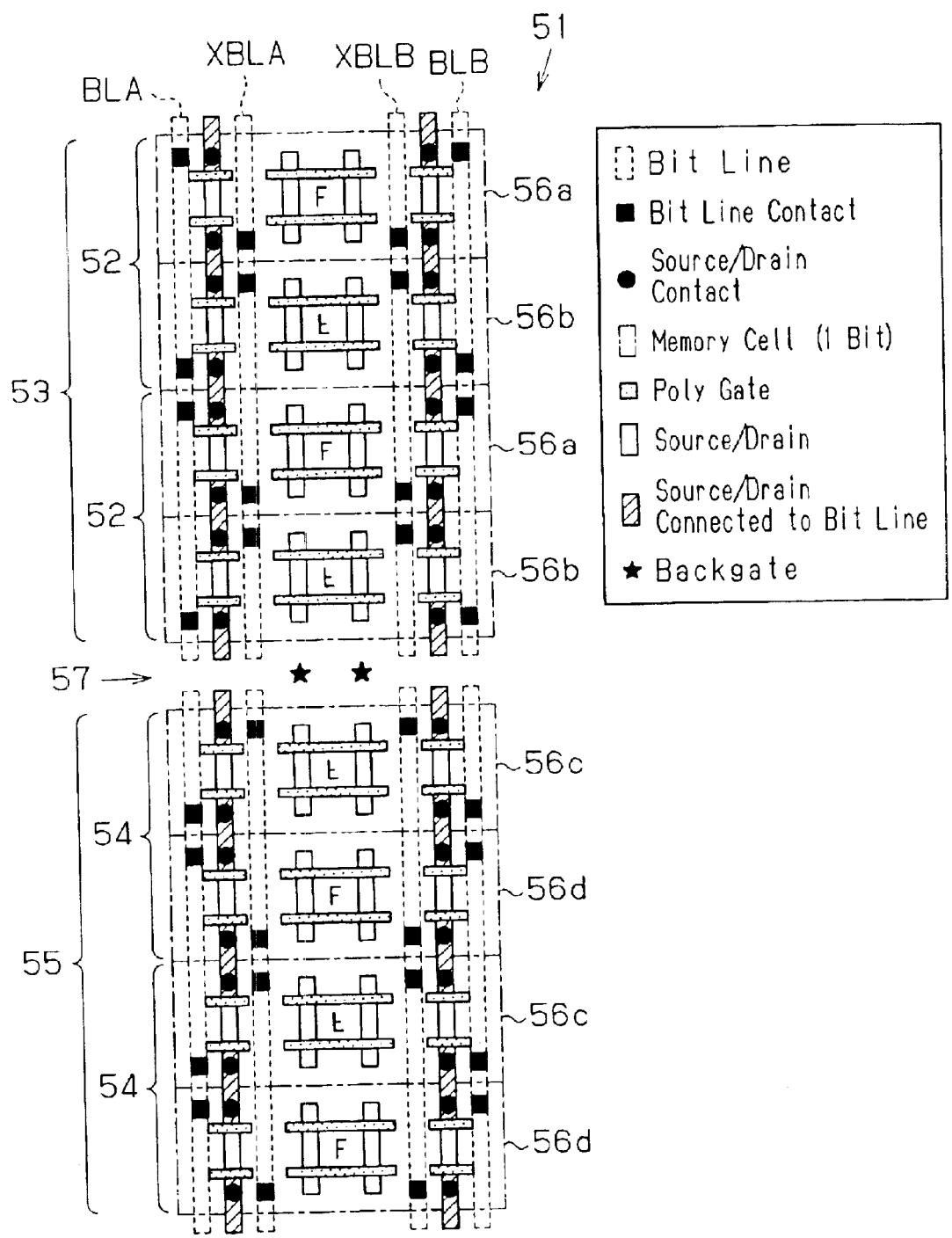
FIG. 11 is a diagram showing a memory cell layout according to a further embodiment of the present invention.

FIG. 11 shows the bulk structure of a memory cell array 51 for a semiconductor memory device that is laid out in accordance with the second embodiment. In the second embodiment, adjacent memory cells in each sub array share sources and drains but do now share bit line contacts.

The memory cell arrays 51 includes a first sub array 53 configured by at least one first cell unit 52, a second sub array 55 configured by at least one second cell unit 54, and a non-memory cell region 57 located between the sub arrays 53 and 55.

The first cell unit 52 includes two types of memory cells 56a and 56b having a symmetric geometrical relationship with respect to the X axis direction, which is perpendicular to each bit line (as shown by the reversed letters F in FIG. 11). The two types of the memory cells 56a and 56b are arranged alternately and adjacent to each other. The adjacent memory cells 56a and 56b share only sources and drains of transistors and do not share bit line contacts.

The second cell unit 54 includes two types of memory cells 56c and 56d having a symmetric geometrical relationship with respect to the X axis direction (as shown by the reversed letters F in FIG. 11). The memory cells 56c and 56d of the second cell unit 54 have a geometric shape obtained by reversing the memory cells 56a and 56b of the first cell unit 52 with respect to the X axis direction. The adjacent memory cells 56c and 56d share only sources and drains of transistors and do not share bit line contacts.

In the memory cell array 51, the number of sources and drains (as depicted by the slanted lines in FIG. 11) connected to bit line contacts of each bit line is five. This number is the same in complementary bit lines (bit line BLA and X bit line XBLA, and bit line BLB and X bit line XBLB). Since the bit line BLA and the X bit line XBLA have substantially the same source-drain capacitance and wire load capacitance, the access time of the two sets of complementary bit lines are substantially the same.

It should be apparent to those skilled in the art that the present invention may be embodied in many other specific forms without departing from the spirit or scope of the invention. Particularly, it should be understood that the present invention may be embodied in the following forms.

The memory cell arrays 11 and 51 may be configured without using a cell unit including a plurality of memory cells. In other words, each of the memory cell arrays 11 and 51 are configured by alternately reversing adjacent memory cells. Further, the memory cells arranged on each side of the non-memory cell regions 17 and 57 are oriented in the same direction. Accordingly, the memory cells may be arranged one by one without configuring cell units.

In the first embodiment, each of the cell units 12 and 14 are configured by two memory cells. However, the number of memory cells is not limited to two and may also be any even number that is greater than four. For example, the first cell unit 12 may be configured by alternately arranging four of the memory cells 16a and 16b next to one another, and the second cell unit 14 may be configured by alternately arranging four of the memory cells 16c and 16d next to one another.

Figure 12:
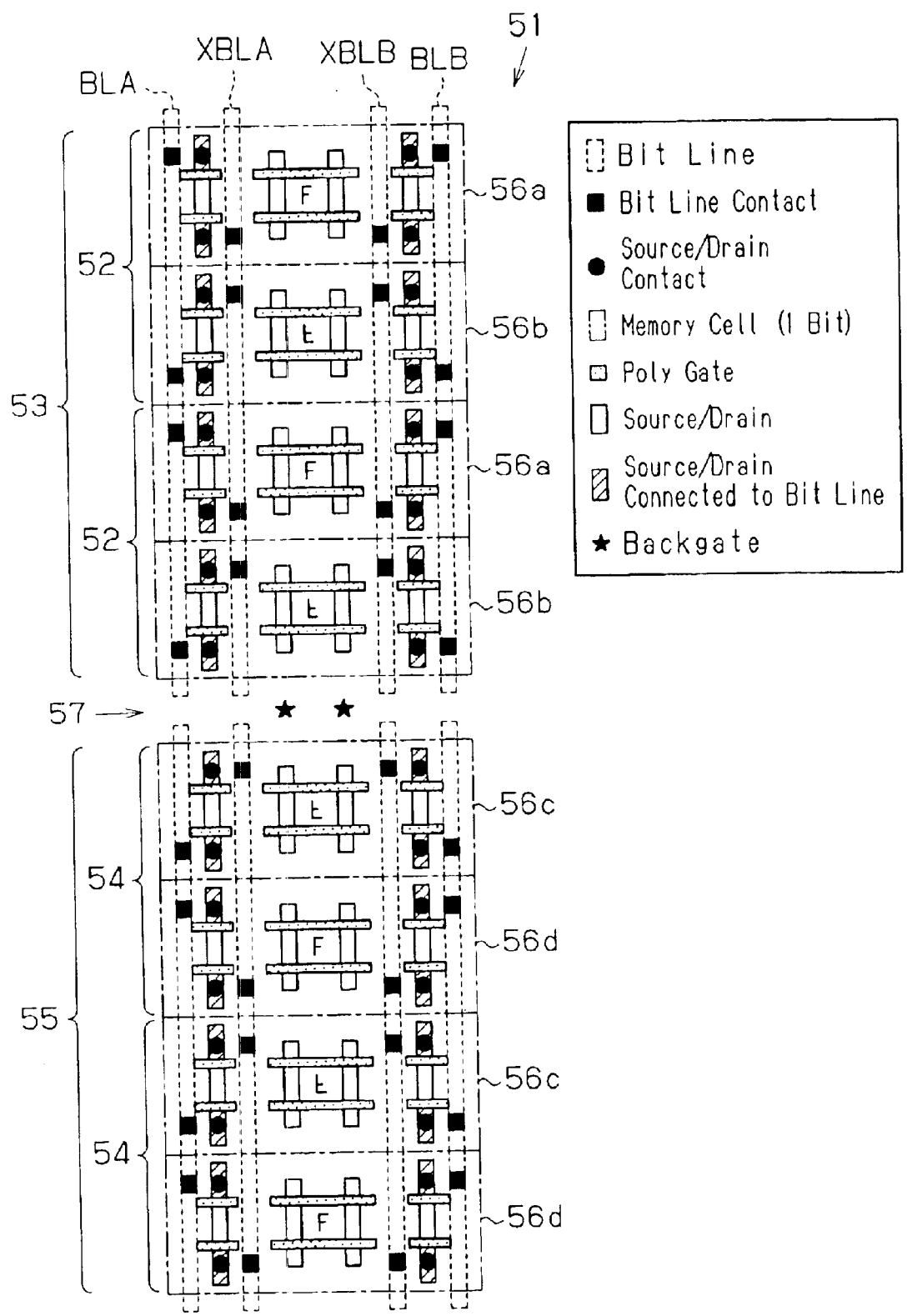
FIG. 12 is a diagram showing an example in which the sources and drains are separated between memory cells.

In the second embodiment, the adjacent memory cells share sources and drains. However, the sources and drains do not necessarily have to be shared. In other words, referring to FIG. 12, sources and drains may be separated between the memory cells 56a and 56b and between the memory cells 56c and 56d. In this case, load is substantially equalized between the pairs of bit lines (the bit line BLA and the X bit line XBLA, and the bit line BLB and the X bit line XBLB).

In the first embodiment, the sub arrays 13 and 15 are shown as one each in FIG. 4. However, a plurality of the first sub arrays 13 and a plurality of the second sub arrays 15 are actually used with the first sub array 13. Further, the non-memory cell region 17 and the second sub array 15 are arranged alternately. As long as the same number of the first and second sub arrays 13 and 15 are configured in the Y axis direction, the number of bit line contacts in the pairs of bit lines (the bit line BLA and the X bit line XBLA, and the bit line BLB and the X bit line XBLB) are the same. If the number of the first sub array 13 differs from that of the second sub array in the Y axis direction, the difference between the number of bit line contacts in one of the bit lines and that of the other one of the bit lines is only one. For example, in FIG. 4, subsequent to the second sub array 15, when configuring the non-memory cell region 17 and then the first sub array 13, the number of bit line contacts in the X bit lines XBLA and XBLB is only one greater than that of the bit lines BLA and BLB. Nevertheless, the maximum difference of the bit line contacts between the complementary lines is one. Thus, the load between complementary bit lines is substantially the same. This also applies to the second embodiment.

In the first and second embodiments, two pairs of complementary bit lines (the bit line BLA and the X bit line XBLA, and the bit line BLB and the X bit line XBLB) are employed. However, the present invention may be applied to a memory cell having only one pair of complementary bit lines.

In the first and second embodiments, the present invention is applied to an eight transistor type SRAM memory cell. However, the memory cell is not necessarily restricted to such a cell configuration.

Figure 13:
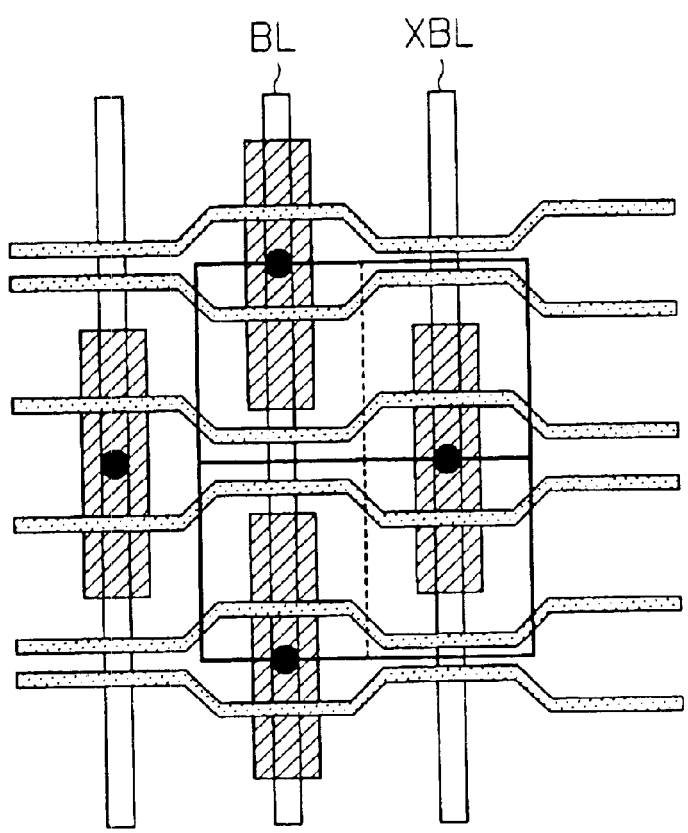
FIG. 13 is a layout diagram showing an example in which the present invention is applied to a DRAM memory cell.

In the first and second embodiments, the present invention is applied to the layout of a SRAM memory cell. However, the present invention may be applied to the layout of a DRAM memory cell. More specifically, referring to FIG. 13, in a normal DRAM memory cell, a memory cell connected to an X bit line XBL, which is used for reference, is arranged next to a memory cell connected to a bit line BL. The two memory cells (two bits) are arranged to form a unit (such as the cell unit in the above embodiments). When doing so, the cell units are reversed at axes perpendicular to the bit lines. Thus, when laying out such DRAM memory cells, the employment of the layouts in the above embodiments obtains the same advantages.

The present examples and embodiments are to be considered as illustrative and not restrictive, and the invention is not to be limited to the details given herein, but may be modified within the scope and equivalence of the appended claims.

What is claimed is:

1. A method for arranging a plurality of memory cells in a predetermined direction along which at least one pair of bit lines extend and to which the memory cells are connected, the method comprising:
   arranging a first memory cell and a second memory cell alternately and adjacent to each other in the predetermined direction, wherein the second memory cell has a symmetric geometrical relationship with the first memory cell with respect to an axis perpendicular to the pair of bit lines;
   arranging a non-cell region adjacent to one of the first and second memory cells in the predetermined direction; and
   arranging a third memory cell having an asymmetric geometrical relationship with the one of the first and second memory cells with respect to the axis in the predetermined direction adjacent to the non-cell region.

2. The method according to claim 1, wherein:
   said arranging a first memory and a second memory alternately includes arranging the first memory cell and the second memory cell so that the first memory cell and the second memory cell are symmetric to each other relative to the axis; and
   said arranging a third memory cell includes arranging the third memory cell so that the third memory cell is asymmetric to the one of the first and second memory cells.

3. The method according to claim 1, wherein said arranging a third memory cell includes arranging the third memory cell and the one of the first and second memory cells oriented to be in the same direction.

4. The method according to claim 1, wherein said arranging a third memory cell includes arranging the third memory cell to have a geometrical relationship with the one of the first and second memory cells so that parallel movement of the third memory cell in the predetermined direction overlaps the third memory cell with the one of the first and second memory cells.

5. The method according to claim 1, wherein the non-cell region is provided for each predetermined number of memory cells, the predetermined number of memory cells each including a transistor, the method further comprising:
   arranging a contact connected to a backgate of the transistor in the non-cell region.

6. The method according to claim 5, further comprising:
   arranging the first and second memory cells so that the first and second memory cells share a bit line contact connected to a source and a drain of the transistor.

7. The method according to claim 1, wherein the plurality of memory cells are SRAM memory cells.

8. A method for arranging a plurality of memory cells along at least one pair of bit lines extending in a predetermined direction, wherein the memory cells each have a first side and a second side that are parallel to a perpendicular axis, which is perpendicular to the at least one pair of bit lines, the method comprising:
   forming a first sub array with at least one first memory cell unit including an even number of memory cells arranged adjacent to one other in the predetermined direction so that the adjacent memory cells have a symmetric geometrical relationship relative to the perpendicular axis, wherein the first side is defined on each of opposite ends of the first memory cell unit in the predetermined direction;
   forming a second sub array with at least one second memory cell unit including an even number of memory cells arranged adjacent to one another in the predetermined direction so that the adjacent memory cells have a symmetric geometrical relationship relative to the perpendicular axis, wherein the second side is defined on each of opposite ends of the second memory cell unit in the predetermined direction;
   alternately arranging the first sub array and the second sub array in the predetermined direction with a non-cell region located in between.

9. The method according to claim 8, wherein the at least one pair of bit lines includes a first bit line and a second bit line, which is complementary to the first bit line, wherein the first memory cell unit is one of a plurality of first memory cell units, and the second memory unit is one of a plurality of second memory cell units, the method further comprising:
   arranging two of the first memory cell units adjacent to each other in the predetermined direction to share at least the second bit line; and
   arranging two of the second memory cell units adjacent to each other in the predetermined direction to share at least the first bit line.

10. The method according to claim 9, further comprising:
   providing a plurality of bit line contacts in each bit line so that two memory cells adjacent to each other in the predetermined direction share the bit line contacts, wherein the bit line contacts in the first bit line and the bit line contacts in the second bit line are arranged alternately in the predetermined direction.

11. The method according to claim 8, wherein said alternately arranging the first sub array and the second sub array includes using the same number of the first sub array and the second sub array.

12. The method according to claim 8, wherein said alternately arranging the first sub array and the second sub array includes using a different number of the first sub array and the second sub array.

13. The method according to claim 8, wherein the number of memory cells configuring the first memory cell unit is the same as the number of memory cells configuring the second memory cell unit.

14. The method according to claim 8, wherein the non-cell region is one of a plurality of non-cell regions, each provided for a predetermined number of memory cells arranged in the predetermined direction, and the predetermined number of memory cells each include a transistor, the method further comprising:

arranging a contact connected to the backgate of the transistor in each of the non-cell regions.

15. The method according to claim 8, further comprising:

arranging a source and a drain of a transistor connected to a bit line contact of the bit lines so that adjacent memory cells share the contact in each sub array.

16. The method according to claim 8, wherein the plurality of memory cells are SRAM memory cells.

17. A semiconductor memory device comprising:

a bit line extending in a predetermined direction; and a memory cell array including a plurality of memory cells arranged along the bit line, the plurality of memory cells including:

a first memory cell;

a second memory cell adjacent to the first memory cell in the predetermined direction and having a geometric shape that is symmetric to the first memory cell with respect to an axis perpendicular to the bit line;

a non-cell region adjacent to the second memory cell in the predetermined direction; and a third memory cell arranged adjacent to the non-cell region in the predetermined direction, wherein the third memory cell and the second memory cell have the same geometric shape and are oriented in the same direction.

18. The semiconductor memory device according to claim 17 wherein:

the first memory cell and the second memory cell are symmetric to each other with respect to the axis; and the second memory cell and the third memory cell have an asymmetric geometric shape with respect to the axis.

19. The semiconductor memory device according to claim 17, wherein the third memory cell has a geometric shape so that parallel movement of the third memory cell in the predetermined direction overlaps the third memory cell with the second memory cell.

20. The semiconductor memory device according to claim 17, wherein the first memory cell and the second memory cell are in a mirror image relationship with respect to a plane perpendicular to the predetermined direction.

21. A method for designing a memory cell array having a pair of bit lines extending in a predetermined direction, the method comprising:

arranging a first memory cell and a second memory cell so that the first and second memory cells have a mirror image relationship with respect to a plane perpendicular to the pair of bit lines;

arranging a non-cell region adjacent to the second memory cell in the predetermined direction; and arranging a third memory cell adjacent to the non-cell region in the predetermined direction so that the third memory cell is oriented in the same direction as the second memory cell.

22. A semiconductor device comprising:

a first bit line pair extending in a predetermined direction;

a second bit line pair extending in the predetermined direction a first memory cell connected to the first bit line pair and the second bit line pair;

a second memory cell connected to the first bit line pair and the second bit line pair adjacent to the first memory cell, wherein the first memory cell and the second memory cell are in a mirror image relationship with respect to a plane perpendicular to the bit line;

a non-memory cell adjacent to the second memory cell; and a third memory cell adjacent to the non-cell region, wherein the third memory cell and the second memory cell are oriented in the same direction.

23. A semiconductor memory device including a bit line extending in a predetermined direction, the semiconductor memory device comprising:

a first memory cell;

a second memory cell adjacent to the first memory cell in the predetermined direction and being symmetric to the first memory cell with respect to a plane perpendicular to the predetermined direction;

a non-cell region adjacent to the second memory cell;

a third memory cell adjacent to the non-cell region and having an asymmetric geometrical relationship with the second memory cell with respect to the plane; and a fourth memory cell adjacent to the third memory cell in the predetermined direction and symmetric to the third memory cell with respect to a plane perpendicular to the predetermined direction.

24. The semiconductor memory device according to claim 23, wherein the third memory cell and the second memory cell are oriented in the same direction.

* * * * *